United States Patent
Park et al.

(10) Patent No.: US 7,679,985 B2
(45) Date of Patent: Mar. 16, 2010

(54) SEMICONDUCTOR MEMORY DEVICE AND ARRANGEMENT METHOD THEREOF

(75) Inventors: Chul-Woo Park, Gyeonggi-do (KR); Sung-Hoon Kim, Gyeonggi-do (KR); Hyuk-Joon Kwon, Gyeonggi-do (KR); Jung-Bae Lee, Gyeonggi-do (KR); Youn-Sik Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 210 days.

(21) Appl. No.: 11/863,141

(22) Filed: Sep. 27, 2007

(65) Prior Publication Data
US 2008/0013397 A1    Jan. 17, 2008

Related U.S. Application Data

(62) Division of application No. 11/225,221, filed on Sep. 12, 2005, now Pat. No. 7,295,454.

(30) Foreign Application Priority Data
Sep. 10, 2004    (KR) ............................... 2004-72761

(51) Int. Cl.
*G11C 8/00*    (2006.01)
(52) U.S. Cl. ..................... 365/230.06; 365/185.13; 365/185.23
(58) Field of Classification Search ............ 365/230.06, 365/185.13, 185.23, 103, 189.03, 180, 173, 365/189.08, 189.09
See application file for complete search history.

(56) References Cited

U.S. PATENT DOCUMENTS

| | | | | |
|---|---|---|---|---|
| 5,650,975 | A | * | 7/1997 | Hamade et al. ........ 365/230.01 |
| 6,980,462 | B1 | | 12/2005 | Ramesh et al. |
| 2006/0023483 | A1 | * | 2/2006 | Lee et al. ..................... 365/63 |

FOREIGN PATENT DOCUMENTS

| | | |
|---|---|---|
| JP | 8-63957 | 3/1996 |
| JP | 9-253806 | 9/1997 |
| JP | 2003-85989 | 3/2003 |
| KR | 2001-0016800 | 3/2001 |

OTHER PUBLICATIONS

English language abstract of Japanese Publication No. 8-63957.
English language abstract of Japanese Publication No. 9-253806.
English language abstract of Korean Publication No. 2001-0016800.
English language abstract of Japanese Publication No. 2003-85989.

* cited by examiner

*Primary Examiner*—Dang T Nguyen
(74) *Attorney, Agent, or Firm*—Volentine & Whitt, PLLC

(57) ABSTRACT

A semiconductor memory device and an arrangement method thereof are disclosed. The semiconductor memory device comprises column selecting signal lines and global data IO signal lines arranged on the same layer in the same direction above a memory cell array; word lines and first local data IO signal lines arranged on a different layer from the column selecting signal lines above the memory cell array, in a perpendicular direction to the column selecting signal lines; and second local data IO signal lines arranged on a different layer from the column selecting signal lines and the word lines above the memory cell array, in the same direction as the first local data IO signal lines.

21 Claims, 9 Drawing Sheets

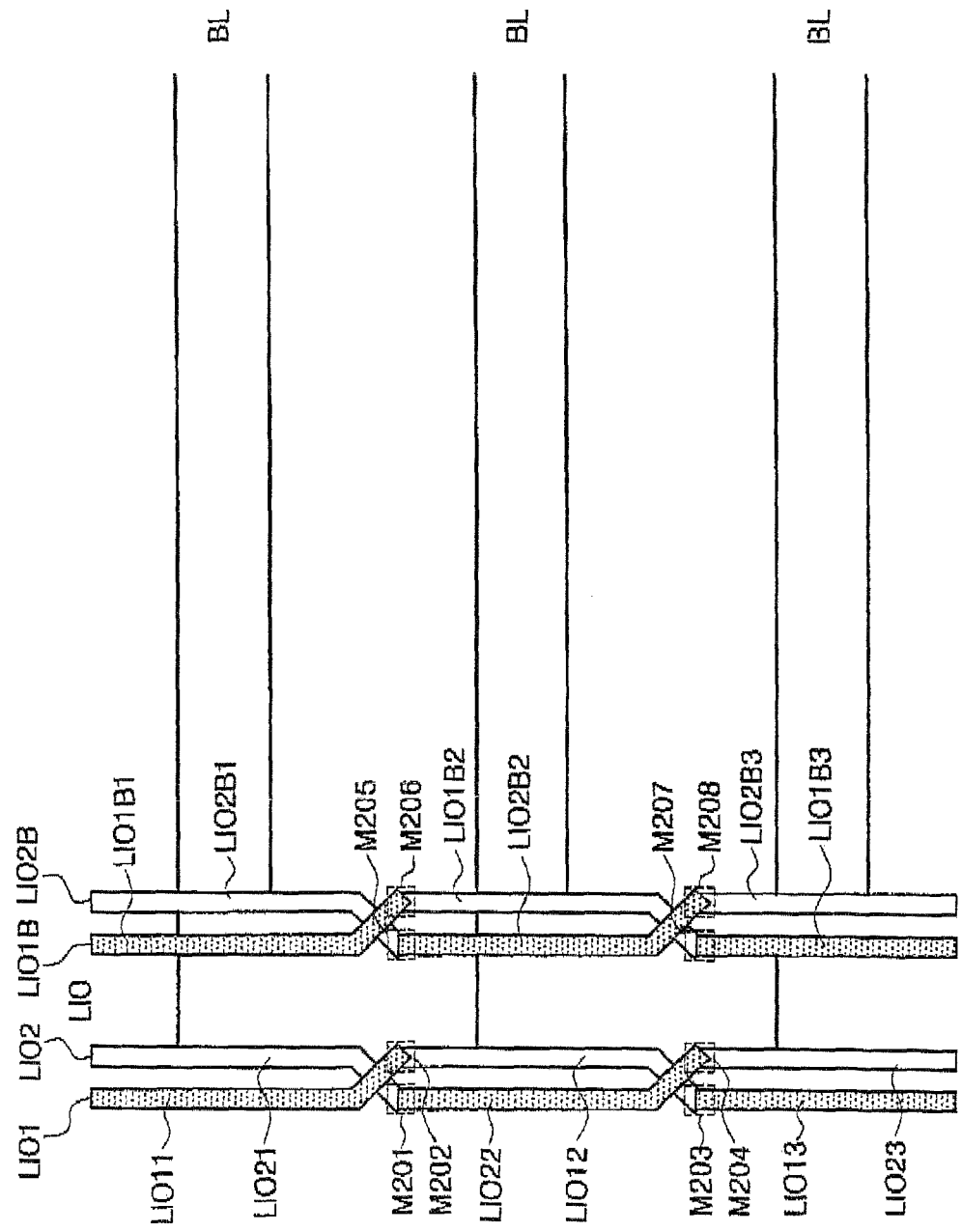

A-A' CROSS-SECTION

US 7,679,985 B2

SEMICONDUCTOR MEMORY DEVICE AND ARRANGEMENT METHOD THEREOF

CROSS-REFERENCE TO RELATED APPLICATION

This application is a Divisional of U.S. patent application Ser. No. 11/225,221, filed on Sep. 12, 2005, now pending, which claims the priority and benefit of Korean Patent Application No. 2004-72761, filed on Sep. 10, 2004, the disclosures of which are hereby incorporated by reference in their entirety.

BACKGROUND OF THE INVENTION

1. Field of the Invention

The invention relates to a semiconductor memory device and, more particularly, to a semiconductor memory device and an arrangement method thereof which can reduce a layout area size.

2. Description of the Related Art

A typical semiconductor memory device includes a memory cell array region and a peripheral circuit region, and data signal lines (e.g., local data IO signal line and global data IO signal line) for receiving and outputting data are arranged on two layers above the regions.

As semiconductor memory devices have become more highly integrated and operating speeds have become faster, the number of data lines have increased, leading to larger layout area sizes.

FIG. 1 is a block diagram illustrating a conventional semiconductor memory device and an arrangement method thereof. Reference numeral 10 denotes a memory cell array, reference symbol CJ denotes a conjunction region, reference symbol SWD denotes a sub word line driver region, reference symbol SA denotes a sense amplifier region, and reference symbol SMCA denotes a sub memory cell array region. And reference symbol MC denotes a memory cell, reference symbol BL denotes a bit line, reference symbol PX denotes word selecting signal lines, reference symbol NWL denotes main word lines, reference symbol SWL denotes sub word lines, reference symbol CSL denotes a column selecting signal line, reference symbol LIO denotes a local data input and output line, and reference symbol GIO denotes a global data input and output line. In the memory cell array 10 of FIG. 1, blocks which include a conjunction region CJ, a sub word line driver region SWD, a sense amplifier region SA, and a sub memory cell array region SMCA are repeatedly arranged in transverse and vertical directions. A sub memory cell array is arranged in the sub memory cell array region SMCA, a control signal generating circuit for controlling a sub word line driver and a control signal generating circuit for controlling a sense amplifier are arranged in the conjunction region CJ, sub word line drivers are arranged in the sub word line driver region SWD, and sense amplifiers are arranged in the sense amplifier region SA.

The function of the components and signal line arrangement of the semiconductor memory device of FIG. 1 are explained below.

The sub memory cell array region SMCA includes memory cell MC connected between a sub word line SWL and a bit line BL, and write/read data to/from the selected memory cell MC. The sense amplifier of the sense amplifier region SA amplifies data of the bit line BL. The sub word line driver region SWD combines signals transmitted to a word selecting signal line PX and a main word line NWL to select the sub word line SWL. Even though not shown, the sub word line driver in the sub word line driver region SWD operates in response to a control signal transmitted from the control signal generating circuit of the conjunction region CJ.

The sub word line SWL is arranged in a vertical direction, and the bit line BL is arranged in a transverse direction. The column selecting signal line CSL, arranged in the same direction as the bit line BL, crosses over the sense amplifier region SA and the sub memory cell array region SMCA, while the main word line NWL, arranged in the same direction as the sub word line SWL, crosses over the sub word line driver region SWD and the sub memory cell array region SMCA. The word line selecting signal line PX, arranged in the same direction as the sub word line SWL, crosses over the conjunction region CJ and the sense amplifier region SA.

FIG. 2 is a block diagram illustrating an arrangement method of the semiconductor memory device of FIG. 1. Referring to FIG. 2, blank boxes show first metal layers arranged in the same layer as the second local data IO signal line, and hatched boxes show second metal layers which connect the first metal layer and the second metal layer to each other and are arranged in different layers from the first and third layers. In FIG. 2, reference symbol SA denotes a sense amplifier region, reference symbol LGIOMUX denotes a local global multiplexer region which transmits data between a local data IO signal line LIO and a global data IO signal line GIO, reference symbol SMCA denotes a sub memory cell array region, reference symbol CJ denotes a conjunction region, reference symbol SWD denotes a sub word line driver region, reference symbol C/D denotes a column address decoder, reference symbol IOSA denotes an input and output sense amplifier, and reference symbol PERI denotes a peripheral circuit region including a row address decoder. In addition, reference symbol LIO denotes a local data IO signal line, reference symbol GIO denotes a global data IO signal line, reference symbol DIO denotes a data IO signal line, reference symbols P1 and P2 denote power lines, and reference symbol CON denotes a sub word line driver control signal line.

Referring to FIG. 2, local data IO signal lines LIO are arranged on a first layer in a vertical direction and cross over the sense amplifier region SA and the conjunction region CJ. Global data IO signal lines GIO are arranged on a second layer in a transverse direction and cross over the sense amplifier region SA and the sub memory cell array region SMCA. Global data IO signal lines GIO are also arranged on the first layer in a vertical direction in a space 1 between the sense amplifier region SA and column address decoders C/D. Further, global data IO signal lines GIO are arranged on the second layer in a transverse direction in a space 2 between the column address decoders C/D next to the sub word line driver region SWD so that they may be connected to the IO sense amplifiers IOSA. Data IO signal lines DIO, which are lines of transmitting signals outputted from the IO sense amplifiers IOSA to a peripheral circuit region PERI, are arranged on a region next to the IO sense amplifiers IOSA on the first layer in a vertical direction.

A power line P2 for supplying electrical power to the IO sense amplifiers IOSA is arranged on the first layer in a vertical direction, and a power line P1 for supplying electrical power to the sub word line driver region SWD is arranged on the second layer in a transverse direction. Since the sub word line driver region SWD requires a high voltage, the power line P1 is designed to have a wider width than the other lines.

Even though not shown, the word selecting signal lines PX, the main word lines NWL and the sub word lines SWL are arranged on the first layer in the same direction as the local data TO signal lines LIO, and the column selecting signal lines CSL are arranged on the second layer in the same direction as the global data IO signal lines GIO. Also, in spaces of the first and second layers in which signal lines are not arranged, other power lines are arranged in the same direction as the local data IO signal lines LIO or the global data IO signal lines GIO, respectively.

The above described arrangement method of the conventional semiconductor memory device has the following disadvantages.

First, as the number of local data IO signal lines LIO is increased, a layout area size of the sense amplifier region SA is also increased. The number of the local data IO signal lines LIO is increased according to increases in density and operating speed of the semiconductor memory device. That is, an increase in density of the semiconductor memory device leads to an increase of memory capacity, whereby the number of the local data IO lines per a unit area is also increased. As a typical method of increasing the operating speed of the memory, the semiconductor memory device increases the amount of data outputted simultaneously from the memory cell array and performs a parallel-to-serial conversion the data before outputting the data for the read operation, and performs a reverse procedure for the write operation. If the operating speed of the memory is increased, the local data IO signal lines LIO is also increased in number.

Therefore, as shown in FIG. 2, the local data IO signal lines LIO are arranged on the first layer above the sense amplifier SA. If the number of the local data IO signal lines LIO is increased, then a layout area size of the sense amplifier region SA is also increased. That is, the efficiency of the layout area size of the semiconductor memory device degrades.

Next, as shown in FIG. 2, since the global data IO signal lines GIO are arranged only in a transverse direction above the sense amplifier SA and the sub memory cell array region SMCA, spaces 1 and 2 are needed. Therefore, the spaces 1 and 2 become larger as the number of the global data IO signal lines GIO is increased.

Even though not shown, the column address decoder C/D has a repair circuit, which connects redundant memory cells in case where inferiority occurs in some memory cells. The repair circuit includes fuses, which should be cut to use the redundant memory cells. Thus, signal lines are not arranged above the column address decoder C/D.

Therefore, as shown in FIG. 2, in order to transmit data transmitted to the global data IO signal lines GIO to the peripheral circuit region PERI through the IO sense amplifier IOSA, the global data IO signal lines GIO are arranged in a transverse direction above the sense amplifier region SA and the sub memory cell array region SMCA, in a vertical direction in a space 1 between the sense amplifier region SA and the column address decoder C/D, and in a transverse direction in a space 2 between the column address decoders C/D. Thus, the spaces 1 and 2 are needed in the arrangement method of the conventional semiconductor memory device of FIG. 2. Further, as described above, with the semiconductor memory device having a higher integration and a higher operating speed, the number of the local data IO signal lines LIO is increased and, thus, the number of the global data IO signal lines GIO is increased. As a result, the spaces 1 and 2 become larger, leading to a larger layout area size of the semiconductor memory device. Therefore, there may be a case where it may be impossible to arrange the global data IO signal lines GIO as shown in the arrangement of FIG. 2.

Also, if the global data IO signal lines are arranged as described above, the IO sense amplifiers IOSA are arranged not in the peripheral circuit region PERI but next to the column address decoders C/D. In such instance, the separate power line P2 is needed to supply the electrical power from the peripheral circuit region PERI, and the data IO signal lines DIO are also needed to transmit signals between the IO sense amplifiers IOSA and the peripheral circuit region PERI. Even though the electrical power is supplied through the power line P2, a voltage drop follows as the IO sense amplifiers IOSA are farther from the peripheral circuit region PERI, leading to various problems.

Finally, since the global data IO signal lines GIO are arranged in a transverse direction above the sense amplifier SA and the sub memory cell array region SMCA, the local global IO multiplexer LGIOMUX, which connects the local data IO signal lines LIO and the global data IO signal lines GIO, should be arranged in the sense amplifier region SA. In such instance, the sense amplifier region SA lacks spaces due to other circuits. Thus, the length of the global data IO signal lines GIO, which extends from the local global IO multiplexer LGIOMUX to the IO sense amplifiers IOSA, becomes lengthy, whereby the layout area is increased.

SUMMARY OF THE INVENTION

The invention provides a semiconductor memory device and an arrangement method of a semiconductor device which can reduce a layout area size.

In a first aspect of the invention, a semiconductor memory device having a memory cell array, includes: column selecting signal lines and global data IO signal lines arranged on the same layer in the same direction above the memory cell array; word lines and first local data IO signal lines arranged on the different layer from the column selecting signal lines above the memory cell array in a perpendicular direction to the column selecting signal lines; and second local data IO signal lines arranged on the different layer from the column selecting signal lines and the word lines above the memory cell array in the same direction as the first local data IO signal lines.

In the first aspect, the first and second local data IO signal lines are divided into a predetermined number of the divided partial local data IO signal lines wherein some of a first plurality of the divided partial local data IO signal lines are arranged in the same layer as the first local data IO signal line and the rest of the first plurality of the divided partial local data IO signal lines of the first local data IO signal line are arranged in the same layer as the second local data IO signal line, while some of a second plurality of the divided partial local data IO signal line are arranged in the same layer as the first local data IO signal line and the rest of the second plurality of the divided partial local data IO signal lines are arranged in the same layer as the second local data IO signal line.

In the first aspect, sub memory cell array regions having memory cells connected between a bit line arranged in a vertical direction to the word lines and a sub word line arranged in the same direction as the word lines, sub word line driver regions arranged up and down between the sub memory cell array regions, and sense amplifier regions arranged in right and left directions between the sub memory cell array regions are included, and the first and second local data signal lines are arranged above the sense amplifier region.

The first and second local data IO signal lines are arranged closely in turn and divided into a predetermined number of partial local data IO signal lines, and one end of each of the divided first local data IO signal lines and one end of each of the adjacent divided second local data IO signal lines are crossed each other.

The global data IO signal lines are arranged above the sense amplifier region and the sub memory cell array regions.

In a second aspect of the invention, a semiconductor memory device having a memory cell array and a peripheral circuit region, includes: word lines and local data IO signal lines arranged on the same layer in the same direction above the memory cell array; column selecting signal lines and first global data IO signal lines arranged on another layer from the word lines above the memory cell array in a perpendicular direction to the word lines; and second global data IO signal lines arranged on the another layer from the column selecting signal lines and the word lines above the memory cell array in a perpendicular direction to the first global data IO signal lines.

The memory cell array includes sub memory cell array regions including memory cells connected between bit lines arranged in a perpendicular direction to the word lines and sub word lines arranged in the same direction as the word lines; sub word line driver regions arranged up and down between the sub memory cell array regions; and sense amplifier regions arranged on left and right sides between the sub memory cell array regions, wherein the peripheral circuit region includes a row address decoder, and the first global data IO signal lines are arranged above the sense amplifier region and the sub memory cell array region, and the second global data IO signal lines are arranged above the sub memory cell array region and the sub word line driver region.

The semiconductor memory device further comprises IO sense amplifiers connected to the second global data IO signal lines and arranged on the peripheral circuit region.

In a third aspect of the invention, a semiconductor memory device including sub memory cell array regions including memory cells connected between bit lines arranged in a perpendicular direction to the word lines and sub word lines arranged in the same direction as the word lines, sub word line driver regions arranged up and down between the sub memory cell array regions, sense amplifier regions arranged on left and right sides between the sub memory cell array regions, and conjunction regions arranged on left and right sides between the sub word line driver regions, the device includes: column selecting signal lines arranged on a different layer from the word line above the sense amplifier region and the sub memory cell array region in a perpendicular direction to the word lines; local data IO signal lines arranged on the same layer as the word lines above the sense amplifier region and the conjunction region in the same direction as the word lines; sub word line driver control signal lines arranged on the different layer from the word lines above the conjunction region and the sub word line driver region in the same direction as the column selecting signal lines; and global data IO signal lines arranged on the different layer from the word lines and the sub word line driver control signal lines above the conjunction region and the sub word line driver region in the same direction as the column selecting signal lines, wherein a local global IO multiplexer which transmits data between the local data IO signal lines and the global data IO signal lines is arranged in the conjunction region.

The global data IO signal lines are arranged on the same layer as the column selecting signal lines.

The sub word line driver control signal lines are arranged on the same layer as the column selecting signal lines.

According to each of the first to third aspects of the semiconductor memory device of the present invention, each of the first and second local data IO signal lines is composed of a plurality of local data IO signal line groups consisting of two local data IO signal line pairs in each group in which local data IO signal lines are respectively composed of predetermined numbers of partial local data IO signal lines.

In the first to third aspects, each of the local data IO signal line groups is composed of two pairs of the local data IO signal lines, these pairs are alternately arranged adjacent to each other, and each of the two pairs of local data IO signal lines is composed of a plurality of partial local data IO signal lines. In addition, in each of the two pairs, a plurality of partial local data IO signal lines constituting the first and second local data IO signal lines are connected to each other in a manner that one end of the first partial local data IO signal line divided from the first local data IO signal line and one end of the second partial local data IO signal line divided from the second local data IO signal line cross over each other to be connected, the first partial local data IO signal line is arranged in the same layer where the first local data IO signal line is arranged, and the second partial local data IO signal line is arranged in the same layer where the second local data IO signal line is arranged.

Further, according to the above-described connection structure, the other end of the first partial local data IO signal line which is arranged in the same layer as the first local data IO signal line and divided from the first local data IO signal line is bent toward a right direction at a predetermined angle so that it overlaps one end of the second partial local data IO signal line which is arranged in the same layer as the second local data IO signal line and divided from the second local data IO signal line, and the other end of the first partial local data IO signal line which is arranged in the same layer as the second local data IO signal line and divided from the second local data IO signal line is bent toward a left direction at a predetermined angle so that it overlaps one end of the second partial local data IO signal line which is arranged in the same layer as the first local data IO signal and divided from the first local data IO signal line. As a result, the connection structure is formed in the form of letter X.

In the first to third aspects of the invention, the memory cell is a dynamic memory cell.

In a first aspect of the invention, an arrangement method of a semiconductor memory device including sub memory cell array regions including memory cells connected between bit lines arranged in a perpendicular direction to word lines and sub words line arranged in the same direction as the word lines, sub word line driver regions arranged up and down between the sub memory cell array regions, sense amplifier regions arranged on left and right sides between the sub memory cell array regions, and a peripheral region having a row address decoder, the method includes: arranging first local data IO signal lines on the same layer as the word lines above the sense amplifier region in the same direction as the word lines; arranging second local data IO signal lines on a different layer from the word line above the sense amplifier region in the same direction as the first local data IO signal lines; arranging column selecting signal lines and first global data IO signal lines on the different layer from the word lines and the second local data IO signal lines above the sub memory cell array region and the sense amplifier region in a perpendicular direction to the word lines; and arranging second global data IO signal lines on the same layer as the second local data IO signal lines above the sub memory cell array region and the sub word line driver region in a perpendicular direction to the first global data IO signal lines.

According to the first aspect of the method of arranging the semiconductor memory device of the present invention, the first local data IO signal line is divided into a predetermined number of partial local data IO signal lines, each of some of the divided partial local data IO signal lines of the first local data IO signal line is arranged in the same layer as the first local data IO signal line, and each of the rest of the divided partial local data IO signal lines of the first local data IO signal line is arranged in the same layer as the second local data IO signal line, while the second local data IO signal line is divided into a predetermined number of partial local data IO signal lines, each of some of the divided partial local data IO signal lines of the second local data IO signal line is arranged in the same layer as the first local data IO signal line, and each of the rest of the divided partial local data IO signal lines of the second local data IO signal line is arranged in the same layer as the second local data IO signal line.

The arrangement method further includes arranging an IO sense amplifier connected to the second global data IO signal lines in the peripheral region.

According to the first aspect of the method of arranging the semiconductor memory device of the present invention, each of the first and second local data IO signal lines is composed of a plurality of local data IO signal line groups consisting of two local data IO signal line pairs in each group in which local data IO signal lines which are composed of a predetermined number of partial local data IO signal lines.

The first local data IO signal line is divided into a predetermined number of partial local data IO signal lines, each of some of the divided partial local data IO signal lines of the first local data IO signal line is arranged in the same layer as the first local data IO signal line, and each of the rest of the divided partial local data IO signal lines of the first local data IO signal line is arranged in the same layer as the second local data IO signal line, while the second local data IO signal line is divided into a predetermined number of partial local data IO signal lines, each of some of the divided partial local data IO signal lines of the second local data IO signal line is arranged in the same layer as the first local data IO signal line, and each of the rest of the divided partial local data IO signal lines of the second local data IO signal line is arranged in the same layer as the second local data IO signal line.

The first and second local data IO signal lines are arranged closely in turn and divided into a predetermined number of partial local data IO signal lines, and one end of each of the divided first local data IO signal lines and one end of each of the adjacent divided second local data IO signal lines are crossed each other.

The first and second local data IO signal lines are divided into a predetermined number of partial local data IO signal lines, and one end of each of the adjacent divided first local data IO signal lines and one end of each of the other adjacent divided first local data IO signal lines are crossed and connected to each other using a layer on which the first local data IO signal lines are arranged and a layer on which the column selecting signal lines are arranged, and one end of each of the adjacent divided second local data IO signal lines and one end of each of the other adjacent divided second local data IO signal lines are crossed and connected to each other using a layer on which the second local data IO signal lines are arranged and a layer on which the column selecting signal lines are arranged.

The arrangement method further includes arranging an IO sense amplifier connected to the second global data IO signal lines in the peripheral region.

In another aspect of the invention, an arrangement method of a semiconductor memory device including sub memory cell array regions having memory cells connected between bit lines arranged in a perpendicular direction to word lines and sub word lines arranged in the same direction as the word lines, sub word line driver regions arranged up and down between the sub memory cell array regions, sense amplifier regions arranged on left and right sides between the sub memory cell array regions, and a conjunction region arranged left and right sides between the sub word line driver regions, the method includes steps of: arranging column selecting signal lines on a different layer from the word lines above the sense amplifier region and the sub memory cell array region in a perpendicular direction to the word lines; arranging local data IO signal lines on the same layer as the word lines above the sense amplifier region and the conjunction region in the same direction as the word line; arranging sub word line driver control signal lines on the different layer from the word lines above the conjunction region and the sub word line driver region in the same direction as the column selecting signal lines; arranging global data IO signal lines on the different layer from the word line and the sub word line driver control signal lines above the conjunction region and the sub word line driver region in the same direction as the column selecting signal lines; and arranging a local global IO multiplexer which transmits data between the local data IO signal lines and the global data IO signal lines in the conjunction region.

The global data IO signal lines are arranged on the same layer as the column selecting signal lines.

The sub word line driver control signal lines are arranged on the same layer as the column selecting signal lines.

BRIEF DESCRIPTION OF THE DRAWINGS

The above and other features and advantages of the embodiments of the invention will become readily apparent by reference to the following detailed description when considered in conjunction with the accompanying drawings.

FIG. 4A is a view illustrating a method of reducing skews between local data IO lines.

DETAILED DESCRIPTION OF THE EMBODIMENTS

Figure 1:
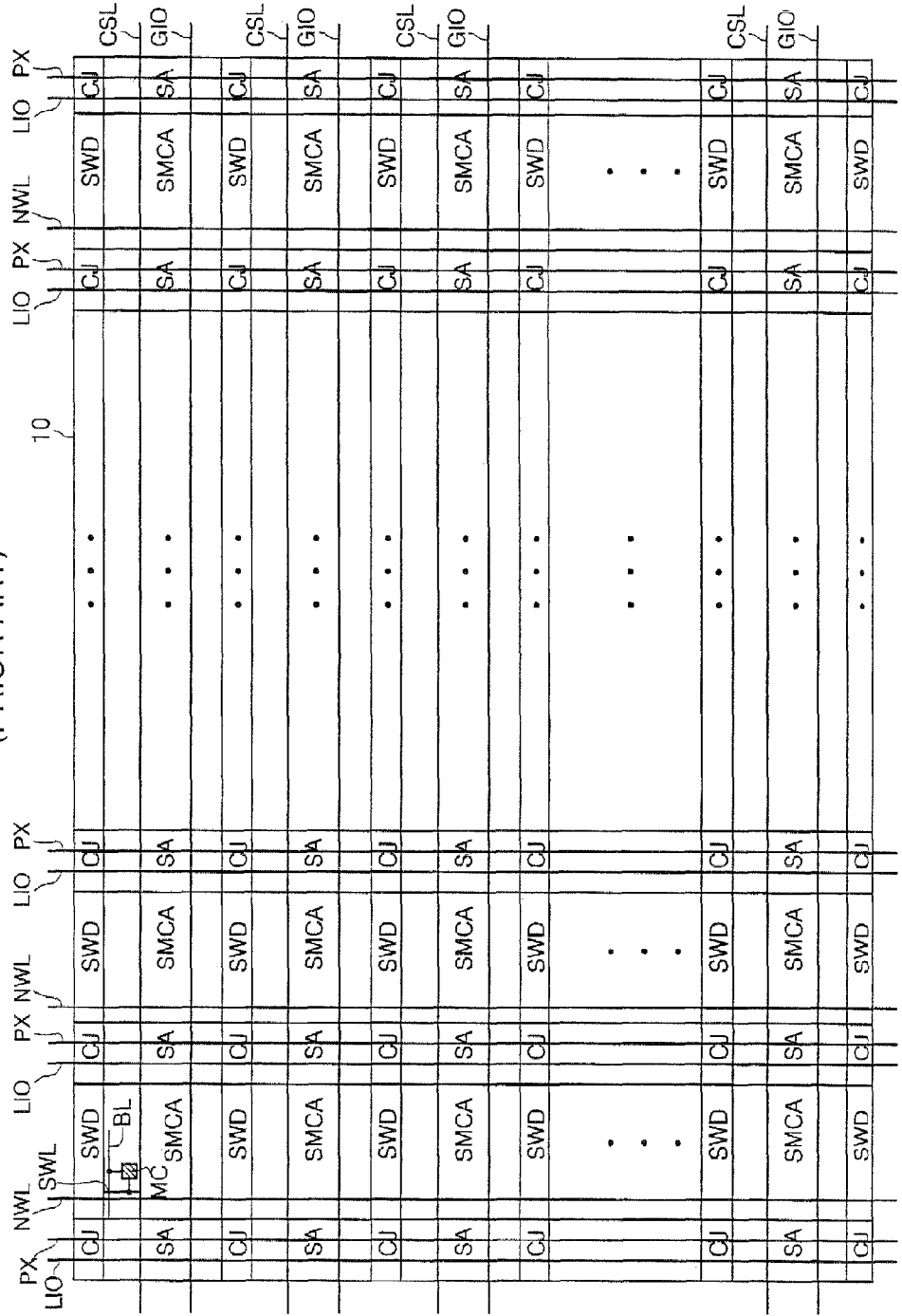
FIG. 1 is a block diagram illustrating a conventional semiconductor memory device and an arrangement method thereof.

The invention will be described below with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like reference numbers refer to like elements throughout the specification.

Figure 3:
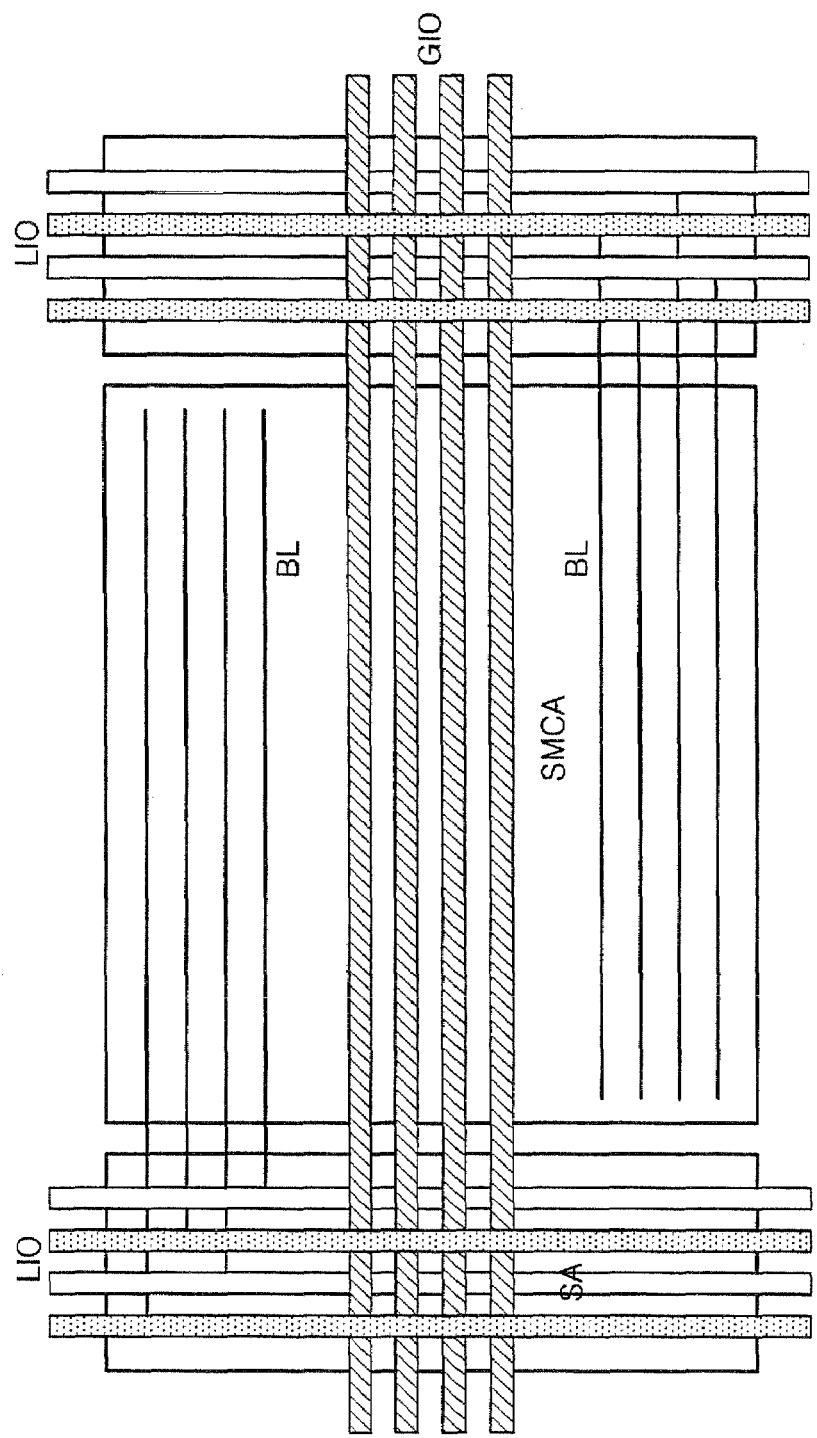
FIG. 3 is a block diagram illustrating an arrangement method of a semiconductor memory device according to a first embodiment of the invention.

FIG. 3 is a block diagram illustrating an arrangement method of a semiconductor memory device according to a first embodiment of the invention. FIG. 3 shows only a sense amplifier region SA and a sub memory cell array region SMCA. In FIG. 3, reference symbol LIO denotes the local data IO signal lines, reference symbol GIO denotes the global data IO signal lines, and reference symbol BL denotes the bit lines. In addition, reference symbol SA denotes a sense amplifier region, and reference symbol SMCA denotes a sub memory cell array region.

Referring to FIG. 3, blank boxes denote first metal layers arranged in the same layer as the second local data IO signal line, and boxes fully filled with dots denote third metal layers arranged in the same layer as the first local data IO signal line.

Figure 2:
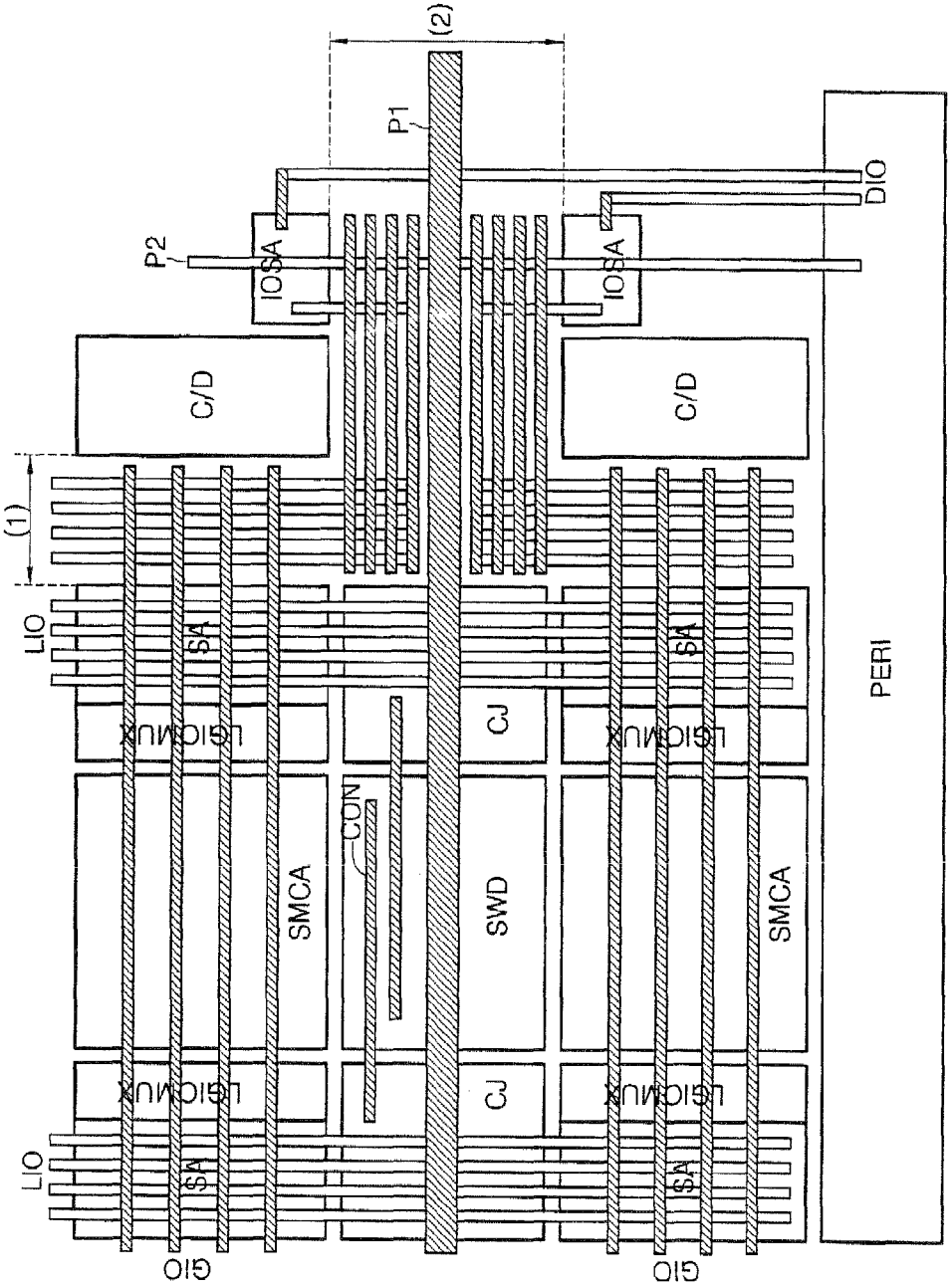
FIG. 2 is a block diagram illustrating an arrangement method of the semiconductor memory device of FIG. 1.

The arrangement of FIG. 3 differs from that of FIG. 2 in that some of the local data IO signal lines LIO are arranged on the third layer. That is, in the arrangement of the semiconductor memory device of FIG. 3, not all of the local data IO signal lines LIO are arranged on the first layer, and some of the local data IO signal lines LIO are arranged on the third layer, thereby reducing a layout area size. For example, half of the local data IO signal lines LIO may be arranged on the first layer, and the other half of the local data IO signal lines LIO may be arranged on the third layer, thereby reducing the layout area size by half.

However, in the arrangement of the semiconductor memory device of FIG. 3, since some of the local data IO signal lines LIO are arranged on the first layer, and the rest of the local data IO signal lines LIO are arranged on the third layer, the local data lines may have skews, i.e., there may be the difference of a transmission rate between the lines.

FIG. 4A is a plan view illustrating a method of reducing skews between local data IO lines LIO in the semiconductor memory device shown in FIG. 3. In FIG. 4A, blank boxes show first metal layers arranged in the same layer as the second local data IO signal line, and boxes fully filled with dots show third metal layers arranged in the same layer as the first local data IO signal line, and hatched boxes show second metal layers which connect the first metal layer and the second metal layer to each other and are arranged in different layers from the first and third metal layers.

FIG. 4A shows an arrangement of two pairs of local data IO lines LIO1, LIO1B and LIO2, LIO2B. The local data IO lines LIO1, LIO1B, LIO2, LIO2B includes three partial local data IO lines LIO11 to LIO13, LIO1B1 to LIO1B3, LIO21 to LIO23, and LIO2B1 to LIO2B3, respectively.

Arrangement method of the local data IO signal lines of FIG. 4A is explained below.

First, the local data IO signal lines LIO1 and LIO2 are closely arranged, and the inverted local data IO signal lines LIO1B and LIO2B are closely arranged. The partial local data IO signal lines LIO11 to LIO13 are arranged alternately in order of the third layer, the first layer and the third layer, respectively, and the partial local data IO signal lines LIO21 to LIO23 are arranged alternately in order of the first layer, the third layer and the first layer, respectively. The partial local data IO signal lines LIO11 to LIO13 and the partial local data IO signal lines LIO21 to LIO23 are arranged such that corresponding portions are arranged on different layers, i.e., the first and third layers not to overlap each other. Also, one end of each of the partial local data IO signal lines LIO11 and LIO21 are bent at 45° toward the corresponding ends of the partial local data IO signal lines LIO12 and LIO22 so that one end of each of the partial local data IO lines LIO11 and LIO21 and the corresponding ends of the partial local data IO lines LIO12 and LIO22 may be arranged to overlap in the form of letter X. Even though not shown, one end of the partial local data IO signal line LIO11 and the corresponding end of the partial local data IO signal line LIO12 which overlap each other are connected to each other through a via (not shown), and one end of the partial local data IO signal line LIO21 and the corresponding end of the partial local data IO signal line LIO22 which overlap each other are connected to each other through a via (not shown). Similarly, the other ends of the partial local data IO signal lines LIO22 and LIO12 are bent at 45° toward the corresponding ends of the partial local data IO signal lines LIO23 and LIO13 so that the other ends of the partial local data IO signal lines LIO22 and LIO12 and the corresponding ends of the partial local data IO signal lines LIO23 and LIO13 may be arranged to overlap in the form of letter X. Even though not shown, the other end of the partial local data IO signal line LIO12 and the corresponding end of the partial local data IO signal line LIO13 which overlap each other are connected to each other through a via (not shown), and the other end of the partial local data IO signal line LIO22 and the corresponding end of the partial local data IO signal line LIO23 which overlap each other are connected to each other through a via (not shown).

The arrangement method of the partial local data IO signal lines LIO1B1 to LIO1B3 and the partial local data IO signal lines LIO2B1 to LIO2B3 is the same as the arrangement method of the partial local data IO signal lines LIO11 to LIO13 and the partial local data IO signal lines LIO21 to LIO23 described above.

That is, since some of the local data IO signal lines are arranged on the first layer and the rest of the local data IO signal lines are arranged on the third layer, the semiconductor memory device of FIG. 3 may have the difference of transmission rate between the lines due to difference of resistance values in a case where the metal lines arranged on the respective lines are made of different metals. Thus, the difference of transmission rate between the lines can be reduced such that the local data IO signal lines are divided into a predetermined number of partial local data IO signal lines, each of the local data IO signal lines includes a predetermined number of partial local data IO signal lines, and the partial local data IO signal lines are alternately arranged on the first and third layers, as shown in FIG. 4A.

That is, the local data IO line LIO arranged in the same layer as the second local data IO signal line and the local data IO line LIO arranged in the same layer as the first local data IO signal line are alternately arranged when seen from a top view and are divided into a predetermined number of partial local data IO signal lines. One ends of the divided partial local data IO lines LIO are bent at a predetermined angle (e.g., 45°) to be cross-connected. At the crossed regions, each of the local data IO signal lines LIO arranged in the same layer as the second local data IO signal line and each of the local data IO signal lines LIO arranged in the same layer as the first local data IO signal line are connected to each other. The first and second local data IO signal lines are divided into local data IO signal line groups, and each of the local data IO signal line groups is composed of two pairs of the local data IO signal lines, and these pairs are alternately arranged adjacent to each other, and each of the two pairs of the local data IO signal lines is composed of a plurality of partial local data IO signal lines. In addition, in each of the two pairs, the plurality of partial local data IO signal lines are connected to each other in a manner that one end of the first partial local data IO signal line divided from the first local data IO signal line and one end of the second partial local data IO signal line divided from the second local data IO signal line cross over each other, and the first partial local data IO signal line is arranged in the same layer where the first local data IO signal line is arranged, and the second partial local data IO signal line is arranged in the same layer where the second local data IO signal line is arranged.

Further, according to the above-described connection structure, the other end of the first partial local data IO signal line which is arranged in the same layer as the first local data IO signal line and divided from the first local data IO signal line is bent toward a right direction at a predetermined angle so that it overlaps one end of the second partial local data IO signal line which is arranged in the same layer as the second local data IO signal line and divided from the second local data IO signal line, and the other end of the first partial local data IO signal line which is arranged in the same layer as the second local data IO signal line and divided from the second local data IO signal line is bent toward a left direction at a predetermined angle so that it overlaps one end of the second partial local data IO signal line which is arranged in the same layer as the first local data IO signal and divided from the first local data IO signal line. As a result, the connection structure is formed in the form of letter X.

Referring to FIG. 4A, two pairs of local data IO signal lines LIO1 and LIO2, and LIO1B and LIO2B are shown.

Figure 4B:
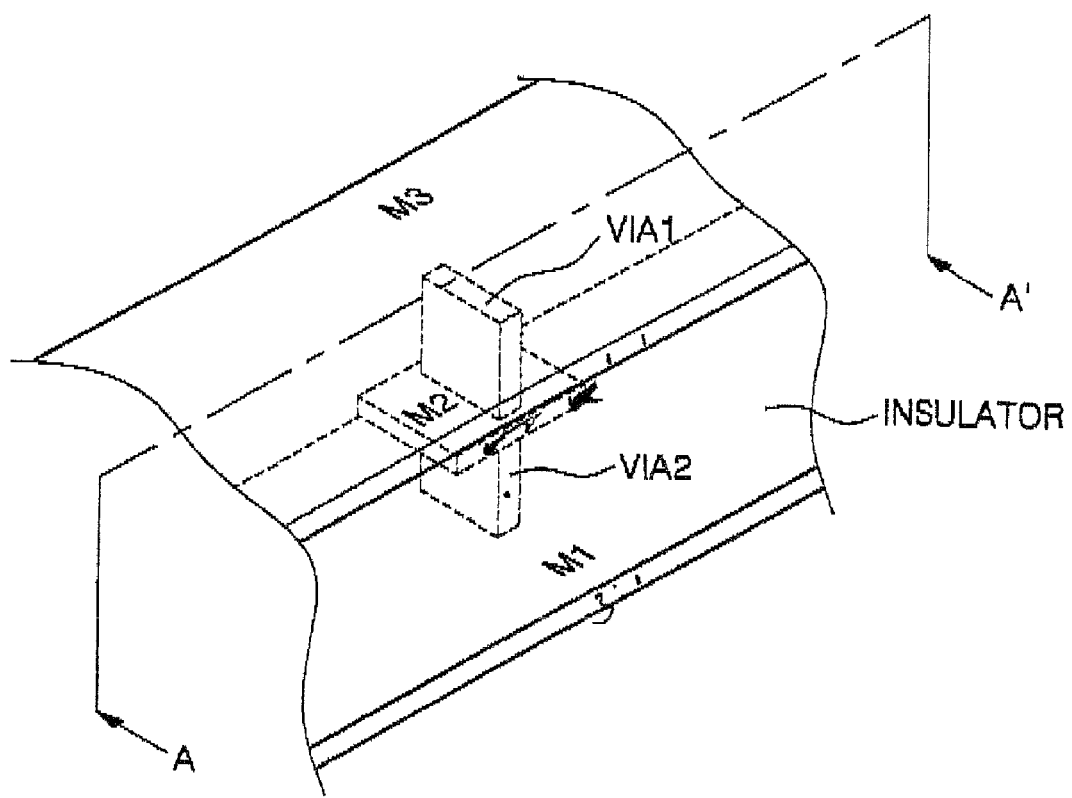
FIG. 4B is a three-dimensional view of a connection of partial local data IO signal lines.

In the first pair of local data IO signal lines LIO1 and LIO2, the first local data IO signal line LIO1 is composed of three partial local data IO signal lines LIO11, LIO12, and LIO13. The other end of the partial local data IO signal line LIO11 arranged in the same layer as the first local data IO signal line is connected to one end of the partial local data IO signal line LIO12 arranged in the same layer as the second local data IO signal line. This connection is made by a second metal pillar M202 arranged in an intermediate layer formed between the first and second local data IO signal lines. A first via (not shown) is formed above the second metal pillar M202 denoted as a dotted line, and a second via (not shown) is also formed below the second metal pillar M202. FIG. 4B shows the connection in a three dimensional manner. Referring to FIG. 4B, reference symbol M1 corresponds to the twelfth partial local data IO line LIO12 arranged in the same layer as the second local data IO signal line, reference symbol M2 corresponds to the second metal pillar M202 arranged in the intermediate layer formed between the first and second local IO signal lines, and reference symbol M3 corresponds to the partial local data IO signal line LIO11 arranged in the same layer as the first local data IO signal line. Accordingly, the partial local data IO signal line LIO12 arranged in the second local data IO signal line is connected to the second metal pillar M202 arranged in the intermediate layer formed between the first and second local TO signal lines through the first via VIA1 formed above the second metal pillar M202, and the second metal pillar M202 is connected to the partial local data IO signal line LIO11 arranged in the same layer as the first local data IO signal line through the second via VIA2 formed below the second metal pillar M202, so that the connection between the twelfth partial local data IO line LIO12 arranged in the same layer as the second local data IO signal line and the partial local data IO signal line LIO 011 arranged in the same layer as the first local data IO signal line may be made.

Figure 4C:
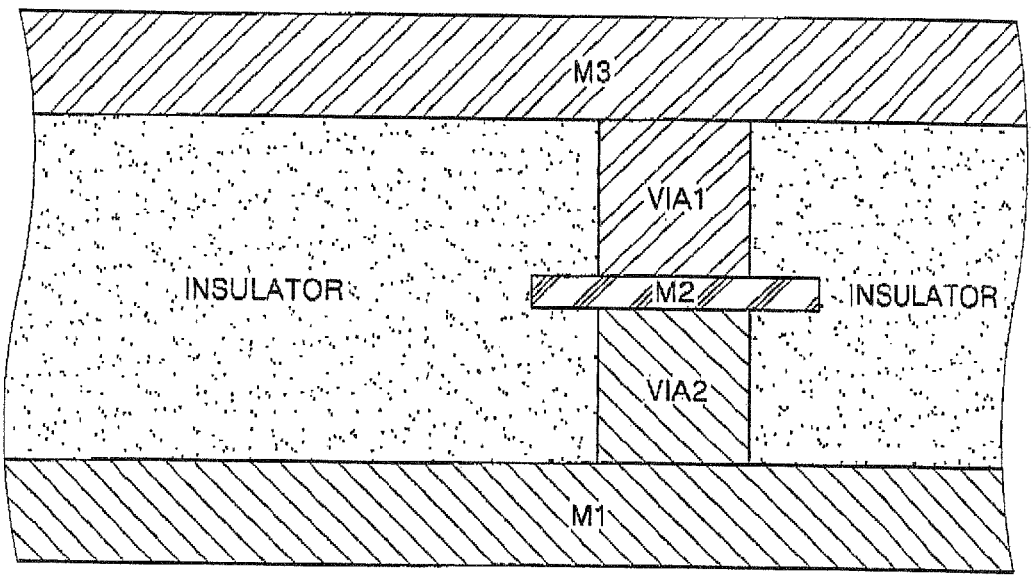
FIG. 4C is a cross-sectional view of the connection in FIG. 4B.

FIG. 4C is a cross-sectional view taken along line A-A' in FIG. 4B, seen from a arrow direction.

Referring to FIG. 4C, the connection between the twelfth partial local data IO line LIO12 arranged in the same layer as the second local data IO signal line and the partial local data IO signal line LIO11 arranged in the same layer as the first local data IO signal line is made by the second metal pillar M202 arranged in the intermediate layer formed between the first and second local IO signal lines. In addition, the second metal pillar M202 arranged in the intermediate layer formed between the first and second local IO signal lines is covered by an insulator (not denoted). The first via VIA1 is formed such that it penetrates from an upper part of the insulator formed in a lower part of the second metal layer M2 to an upper part of the second metal pillar M202, and the second via VIA2 is formed such that it penetrates from a lower part of the second metal pillar M202 to an upper part of the first metal layer M1 formed in a lower part of the insulator. A metal to be filled in the first via VIA1 is equal to or different from the third metal layer M3. And a metal to be filled in the second via VIA2 is equal to or different from the second metal pillar M202.

Referring to FIG. 4A, a third metal pillar M203 is shown as a dotted line. In addition, the other end of the partial local data IO signal line LIO12 arranged in the first layer is connected to one end of the thirteenth partial local data IO line LIO13 arranged in the same layer as the first local data IO signal line by the third metal pillar M203 shown as a dotted line and vias (not shown), as in the connection between the partial local data IO signal line LIO11 and the twelfth local data IO signal line LIO12.

The connection between the second metal pillar M202 and the vias (not shown) is the same as FIGS. 2 and 4B, and a description thereof is the same as that of the connection between the partial local data IO signal line LIO11 and the partial local data IO signal line LIO12. In this case, the partial local data IO signal line LIO12 corresponds to the first metal layer M1, the thirteenth partial local data IO line LIO13 corresponds to the third metal layer M3, and the third metal pillar M203 corresponds to the intermediate layer M2.

Referring to FIG. 4, the second local data IO signal line LIO2 is composed of three partial local data IO signal lines LIO21, LIO22, and LIO23, similar to the first local data line LIO1. The other end of the partial local data IO signal line LIO21 arranged in the same layer as the second local data IO signal line is connected to one end of the partial local data IO signal line LIO22 arranged in the same layer as the first local data IO signal line. This connection is made by a first metal pillar M201 shown as a dotted line and vias (not shown), and the connection between the vias and the first metal pillar M201 is the same as FIGS. 4B and 4C. In this case, the partial local data IO signal line LIO21 corresponds to the first metal layer M1, the twenty second partial local data IO line LIO22 corresponds to the third metal layer M3, and the first metal pillar M201 corresponds to the second metal layer.

In the same manner, the partial local data IO signal line LIO22 and the partial local data IO signal line LIO23 are connected to each other by a fourth metal pillar M204 shown as a dotted line and vias (not shown). In this case, the connection between the vias (not shown) and the fourth metal pillar M204 is the same as FIGS. 4B and 4C, and the partial local data IO signal line LIO22 corresponds to the third metal layer M3, the twenty third partial local data IO line LIO23 corresponds to the first metal layer M1, and the fourth metal pillar M204 corresponds to the second metal layer M2.

The second pair of local data IO signal lines LIO1B and LIO2B is also connected in the same manner as the first pair of local data IO signal lines LIO1 and LIO2.

That is, the third local data IO signal line LIO1B is composed of three partial local data IO signal lines LIO1B1, LIO1B2, and LIO1B3. A connection between the other end of the partial local data IO signal line LIO1B1 arranged in the same layer as the first local data IO signal line and one end of the partial local data IO signal line LIO1B2 arranged in the same layer as the second local data IO signal line is made by vias (not shown) and a sixth metal pillar M206 shown as a dotted line, and the other end of the partial local data IO signal line LIO1B2 is connected to one end of the partial local data IO signal line LIO1B3 arranged in the same layer as the first local data IO signal line by the vias (not shown) and a seventh metal pillar M207. The fourth local data IO signal line LIO2B is also composed of three partial local data IO signal lines LIO2B1, LIO2B2, and LIO2B3. The other end of the partial local data IO signal line LIO2B1 arranged in the same layer as the second local data IO signal line is connected to one end of the partial local data IO signal line LIO2B2 by the vias (not shown) and a fifth metal pillar M205. The other end of the partial local data IO signal line LIO2B2 is connected to one end of the forty third partial data IO signal line LIO2B3 by the vias (not shown) and an eighth metal pillar M208. In this case, the connection is the same as FIGS. 4B and 4C, and the partial local data IO signal line LIO1B2, the partial local data IO signal line LIO2B1, and the partial local data IO signal line LIO2B3 respectively correspond to the first metal layer M1, and the partial local data IO signal line LIO1B1, the partial local data IO signal line LIO2B3, and the partial local data IO signal line LIO2B2 respectively correspond to the third metal layer M3. In addition, the fifth to eighth metal pillars correspond to the second metal layers as intermediate layers.

Figure 5:
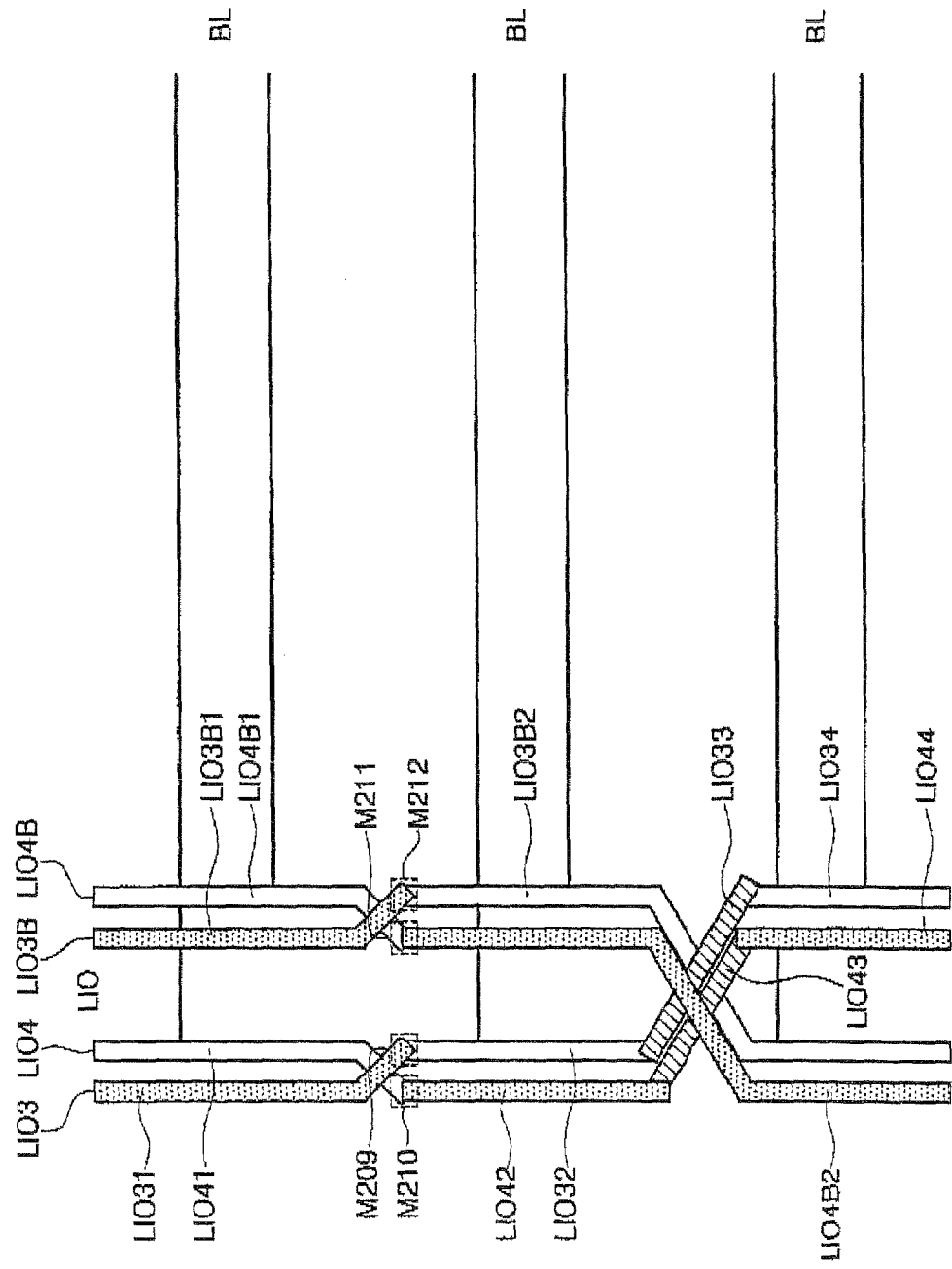
FIG. 5 is a view illustrating another method of reducing skews between the local data IO signal lines.

FIG. 5 is a plan view illustrating another method of reducing skews between local data IO signal lines LIO in the semiconductor memory device shown in FIG. 3, and blank boxes show first metal layers arranged in the same layer as the second local data IO signal line, and boxes fully filled with dots show third metal layers arranged in the same layer as the first local data IO signal line, and hatched boxes show second metal layers which connect the first metal layer and the second metal layer to each other and are arranged in different layers from the first and third layers.

The local data IO signal lines LIO are divided into a predetermined number of local data IO signal line groups, and each of the divided local data IO signal line groups includes two pairs of the local data IO signal lines. In addition, one local data IO signal line of the two pairs of local data IO signal lines is composed of a plurality of partial local data IO signal lines.

Among the partial local data IO signal lines, one end of each of some of the partial local data IO lines arranged in the same layer as the second local data IO signal line is bent at a predetermined angle (e.g., 45°), and one end of each of the rest of the partial local data IO lines arranged in the same layer as the first local data IO signal line is bent at a predetermined angle (e.g., 45°) so that their one ends may cross over each other. And each end of the bent parts overlaps each other to be connected. In the similar way, one of the adjacent local data IO lines LIO arranged in the same layer as the first local data IO signal line is bent at a predetermined angle (e.g., 45°) in the same layer as the first local data IO signal line, and another one thereof is bent at a predetermined angle (e.g., 45°) using an intermediate layer so that the ones may cross over each other. And each end of the bent parts overlaps each other to be connected.

Referring to FIG. 5, two pairs of local data IO signal lines LIO3 and LIO4, and LIO3B and LIO4B are shown.

In the third pair of local data IO lines LIO3 and LIO4, the fifth local data IO line LIO3 is composed of four partial local data IO lines LIO31, LIO32, LIO33, and LIO34. The other end of the fifty first partial local data IO line LIO31 is connected to one end of the fifty second partial local data IO line LIO32 by vias (not shown) and a ninth metal pillar M209. This connection is made by the metal filled into the first via VIA1, the metal filled into the second via VIA2, and the second metal layer as can be seen in FIGS. 4B and 4C. The fifty first partial local data IO line LIO31 corresponds to the third metal layer M3, the fifty second partial local data IO line LIO32 corresponds to the first metal layer M1, and the ninth metal pillar M209 corresponds to the second metal layer M2.

In the third pair of local data IO lines LIO3 and LIO4, the sixth local data IO line LIO4 is also composed of four partial local data IO lines LIO41, LIO42, LIO43, and LIO44. The other end of the sixty first partial local data IO line LIO41 arranged in the same layer as the second local data IO signal line is connected to one end of the sixty second partial local data IO line LIO42 arranged in the same layer as the first local data IO signal line by vias (not shown) and a tenth metal pillar M210. This connection is the same as FIGS. 4B and 4C, and the sixty first partial local data IO line LIO41 corresponds to the first metal layer M1, the sixty second partial local data IO line LIO42 corresponds to the third metal layer M3, and the tenth metal pillar M2 IO corresponds to the second metal layer M2.

In the fourth pair of local data IO lines LIO3B and LIO4B, the seventh local data IO line LIO3B is composed of two partial local data IO lines LIO3B1 and LIO3B2. The eighth local data IO line LIO4B is also composed of two partial local data IO lines LIO4B1 and LIO4B2.

The other end of the seventy first partial local data IO line LIO3B1 arranged in the same layer as the first local data IO signal line is connected to one end of the seventy second partial local data IO line LIO3B2 arranged in the same layer as the second local data IO signal line by vias (not shown) and a twelfth metal pillar M212 shown as a dotted line. This connection is the same as FIGS. 4B and 4C, and the seventy first partial local data IO line LIO3B1 corresponds to the third metal layer M3, the seventy second partial local data IO line LIO3B2 corresponds to the first metal layer M1, and the twelfth metal pillar M212 corresponds to the second metal layer M2.

In the eighth pair of local data IO line LIO4B, the other end of the eighty first partial local data IO line LIO4B1 arranged in the same layer as the second local data IO signal line is connected to one end of the eighty second partial local data IO line LIO4B2 arranged in the same layer as the first local data IO signal line by vias (not shown) and an eleventh metal pillar M211. This connection is the same as FIGS. 2 and 4B, and the eighty first partial local data IO line LIO4B1 corresponds to the first metal layer M1, the eighty second partial local data IO line LIO4B2 corresponds to the third metal layer M3, and the eleventh metal pillar M211 corresponds to the second metal layer M2.

First, the partial local data IO lines LIO11 and LIO12 are alternately arranged on the third layer and the first layer in a vertical direction, respectively, the partial local data IO line LIO13 is bent at, for example, 45° to be arranged on the second layer, and the partial local data IO line LIO14 is arranged on the first layer. The partial local data IO lines LIO12 and LIO22 are alternately arranged on the first layer and the third layer, respectively, the partial local data IO line LIO23 is bent at, for example, 45° to be arranged on the second layer, and the partial local data IO line LIO24 is arranged on the third layer. The partial local data IO lines LIO11 and LIO21, LIO12 and LIO22, LIO13 and LIO23, and LIO14 and LIO24 are arranged in a line. One ends of the partial local data IO lines LIO11 and LIO21 are bent at a predetermined angle toward the corresponding ends of the partial local data IO lines LIO12 and LIO22 so that one ends of the partial local data IO lines LIO11 and LIO21 and the corresponding ends of the partial local data IO lines LIO12 and LIO22 are arranged to overlap in the form of letter X. The other ends of the partial local data IO lines LIO12 and LIO22 and the corresponding ends of the partial local data IO lines LIO13 and LIO23 respectively overlap, and the other ends of the partial local data IO lines LIO13 and LIO23 and the corresponding ends of the partial local data IO lines LIO14 and LIO24 respectively overlap. Even though not shown, one ends of the partial local data IO lines LIO11 and LIO21 and the corresponding ends of the partial local data IO line LIO21 and LIO22 which overlap each other are connected to each other through a via (not shown), the other ends of the partial local data IO lines LIO12 and LIO22 and the corresponding ends of the partial local data IO lines LIO13 and LIO23 which overlap each other are connected to each other through a via (not shown), and the other ends of the partial local data IO lines LIO13 and LIO23 and the corresponding ends of the partial local data IO lines LIO 14 and LIO24 which overlap each other are connected to each other through a via (not shown).

The partial local data IO lines LIO1B1 and LIO2B1 are at a predetermined distance from the local data IO lines LIO11 and LIO12 and are arranged the same way as the partial local data IO lines LIO11 and LIO12. One ends of the partial local data IO lines LIO1B1 and LIO2B1 are bent at a predetermined angle (e.g., 45°) to be arranged in the form of letter X. The partial local data IO lines LIO1B2, LIO2B2 are arranged on the first layer and the second layer, respectively. First portions of the partial local data IO lines LIO1B2 and LIO2B2 are arranged on the same line as the partial local data IO lines LIO2B1 and LIO1B1, respectively, and second portions of the partial data IO lines LIO2B2 and LIO1B2 are bent at a predetermined angle to be arranged in the form of letter X with the partial local data IO lines LIO13 and LIO23, respectively, and third portions of the partial local data lines LIO2B2 and LIO1B2 are arranged on the same line as the partial local data IO lines LIO22 and LIO12. Even though not shown, one ends of the partial local data IO lines LIO1B1 and LIO2B1 and corresponding ends of the partial local data IO lines LIO1B2 and LIO2B2 which respectively overlap are connected to each other through a via (not shown).

The embodiment of FIG. 5 has shown that the partial local data IO lines LIO11, LIO12, and LIO14 and the partial local data IO lines LIO21, LIO22, LIO24 are arranged such that corresponding portions are arranged on different layers not to overlap, but the corresponding portions may be arranged to overlap. In this case, connection between the partial local data IO lines LIO11 and LIO21, connection between the partial local data IO lines LIO12 and LIO22, and connection between the partial local data IO lines LIO14 and LIO24 are required. Also, it has been shown that the partial local data IO lines LIO1B1 and LIO2B1 and the partial local data IO lines LIO1B2 and LIO2B2 are arranged such that corresponding portions are arranged on different layers not to overlap, but the corresponding portions may be arranged to overlap. In this case, connection between the partial local data IO lines LIO1B1 and LIO2B1 connection between the partial local data IO lines LIO1B2 and LIO2B2 are required.

That is, since some of the local data IO lines are arranged on the first layer and the rest of the local data IO lines are arranged on the third layer, the semiconductor memory device of FIG. 5 may have difference of transmission rate between the lines. Thus, the difference of transmission rate between the lines can be reduced such that the local data IO lines are divided into a predetermined number, each of the local data IO lines includes a predetermined number of partial local data IO lines, and the partial local data IO lines are alternately arranged on the first and third layers.

The arrangement of the local data IO lines according to the present invention is not limited to the embodiment described above and can reduce the difference of transmission rate between the local data IO lines by dividing the local data IO lines into a predetermined number and arranging separately the divided partial local data IO lines on two different layers. That is, the present invention is to arrange a predetermined number of partial local data IO lines which form one local data IO line on two different layers.

Figure 6:
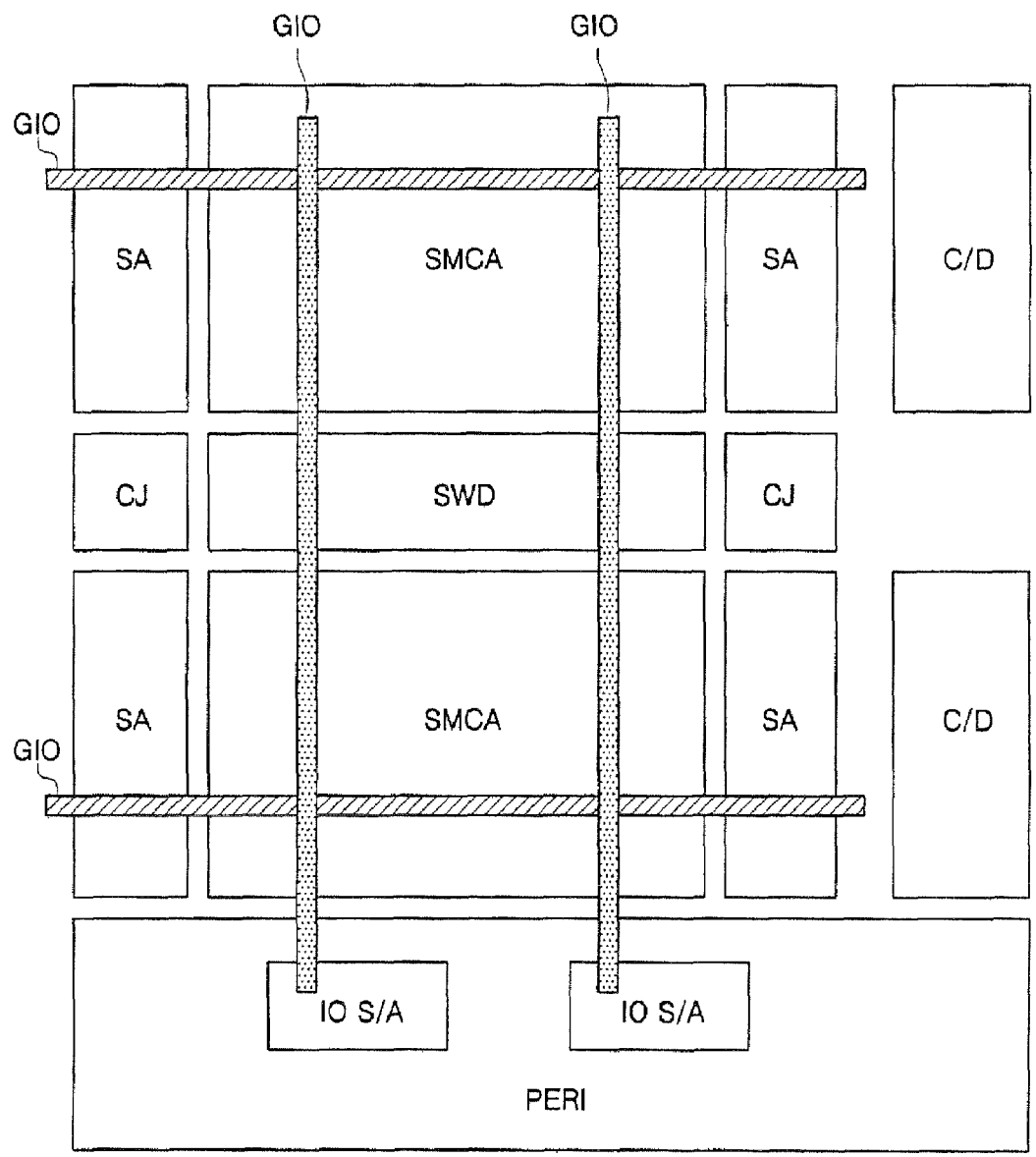
FIG. 6 is a view illustrating an arrangement method of a semiconductor memory device according to a second embodiment of the invention.

FIG. 6 is a block diagram illustrating an arrangement method of the semiconductor memory device according to a second embodiment of the invention. Referring to FIG. 6, blank boxes show first metal layers arranged in the same layer as the second local data IO signal line, and boxes fully filled with dots show third metal layers arranged in the same layer as the first local data IO signal line.

Even though not shown, similar to FIG. 2, a plurality of local data IO signal lines LIO are arranged on the first layer in a vertical direction and cross over the sense amplifier region SA and the conjunction region CJ. Signal lines, such as the main word lines NWL, are arranged in a vertical direction and cross over the sub memory cell array region SMCA and the sub word line driver region SWD, and power lines are arranged in an empty space. The sub word line driver control signal lines and the power lines are arranged on the second layer in a transverse direction to cross over the conjunction region CJ and the sub word line driver region SWD. Even though not shown, the local global IO multiplexer LGIO-MUX is arranged in the sense amplifier region SA.

Contrary to the semiconductor memory device of FIG. 2, the semiconductor memory device of FIG. 6 further includes global data IO signal lines GIO arranged on the third layer in a vertical direction and cross over the sub memory cell array region SMCA and the sub word line driver region SWD. That is, the global data IO signal lines GIO for transmitting signals transmitted through the local data IO signal lines LIO to the peripheral circuit region PERI are arranged on the second layer in a transverse direction, which cross over the sense amplifier region SA and the sub memory cell array region SMCA, and on the third layer in a vertical direction, which cross over the sub memory cell array region SMCA and the sub word line driver region SWD.

Therefore, in the arrangement method of FIG. 6, the space 1 of FIG. 2 is not needed. Further, in the arrangement method of FIG. 6, rather than space 2 of FIG. 2, only a space for the sub word line driver region SWD is needed. Also, by arranging the global data IO signal lines GIO as described above, the global data IO signal lines GIO are connected directly to the peripheral circuit region PERI, whereby the IO sense amplifiers IOSA can be arranged in the peripheral circuit region PERI. As a result, the power problem of FIG. 2 does not occur.

Figure 7:
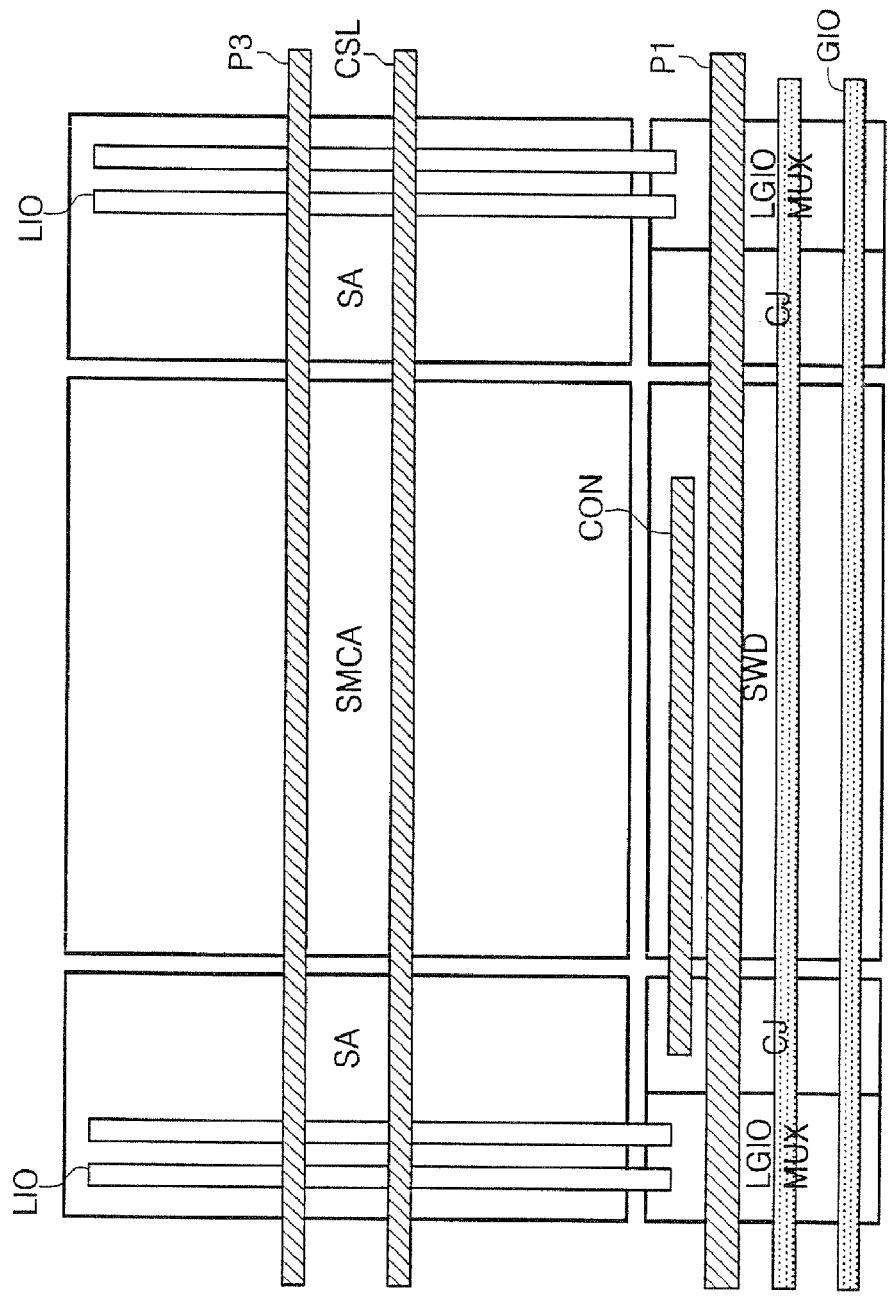
FIG. 7 is a view illustrating an arrangement method of a semiconductor memory device according to a third embodiment of the invention.

FIG. 7 is a block diagram illustrating an arrangement method of the semiconductor memory device according to a third embodiment of the invention. FIG. 7 shows an arrangement method of the global data IO signal lines GIO and the local global IO MUX LGIOMUX. In FIG. 7, the non-hatched lines are lines arranged on the first layer, hatched lines are lines arranged on the second layer, and dotted lines are lines arranged on the third layer.

That is, the semiconductor memory device of FIG. 7 differs from the configuration of FIG. 2 in that the global data IO signal lines GIO are arranged on the third layer in a transverse direction to cross over the conjunction region CJ and the sub word line driver region SWD.

In the semiconductor memory device of FIG. 2, two metal layers for arrangement of the signal lines are provided. The local data IO signal lines LIO are arranged on the first layer in a vertical direction, and the global data IO signal lines GIO are arranged on the second layer in a transverse direction. In such an arrangement, since the sub word line driver control signal line CON and the power line P1 are arranged above the conjunction region CJ and the sub word line driver region SWD, there is no space for the global data IO signal lines GIO.

On the other hand, in the semiconductor memory device of FIG. 7, three metal layers are provided. By arranging the global data IO signal lines GIO on a different layer from the sub word line driver control signal line CON and the power line P1, the global data IO signal lines GIO can be arranged above the conjunction region CJ and the sub word line driver region SWD. Therefore, since the local global IO multiplexer LGIOMUX can be arranged in the conjunction region CJ which has relatively enough space other than the sense amplifier region, a layout area size can be reduced and a layout area can be efficiently used. In addition, the length of the global data IO signal lines GIO, i.e., the length that data arrives at the IO sense amplifiers IOSA, can be reduced. Also, the space 1 of FIG. 2 (that is, a space for the global data IO signal lines GIO between the sense amplifier SA and the column address decoder C/D) is not needed in the arrangement method of FIG. 7. Further, since a power line P3 can be arranged on the second layer on which the global data IO signal lines GIO was arranged, the electrical power supply of the memory cell array can be enhanced.

Thus, the semiconductor memory device of the invention comprises three metal layers, and some of signal lines which were arranged on the first or second layers in the conventional semiconductor memory device are arranged on the third layer, thereby reducing the layout area size.

The semiconductor memory device according to the first embodiment of the invention can reduce a layout area size of the sense amplifier region SA and the conjunction region CJ by arranging some of the local data IO signal lines LIO on the third layer in a vertical direction to cross over the sense amplifier region SA and the conjunction region CJ.

The semiconductor memory device according to the second embodiment of the invention can delete the spaces 1 and 2 of FIG. 2, thereby reducing a layout area size, by additionally arranging the global data IO signal lines GIO on the third layer in a vertical direction to cross over the sub memory cell array region SMCA and the sub word line driver region SWD.

The semiconductor memory device according to the third embodiment of the invention can delete the space 1 of FIG. 2, thereby reducing a layout area size, by arranging the global data IO signal lines GIO in a transverse direction to cross over the conjunction region CJ and the sub word line driver region SWD and, thus, arranging the local global IO multiplexer LGIOMUX in the conjunction region CJ, which has relatively enough space.

The arrangement methods of semiconductor memory devices according to the first and second embodiments of the invention show that the column selecting signal lines and the global data IO signal lines GIO are arranged on the second layer and some of the local data IO signal lines and/or additionally arranged global data IO signal lines are arranged on the third layer, but reverse arrangement thereof is also possible.

In the same way, the signal line arrangement method of the semiconductor memory device according to the third embodiment of the invention shows that the power lines for the sub word line driver region and the sub word line driver control signal line are arranged on the second layer on which the column selecting signal lines are arranged, and the global data IO signal lines are arranged on the third layer, but reverse arrangement thereof is also possible. That is, the global data IO signal lines may be arranged on the second layer, and the sub word line driver control signal lines may be arranged on the third layer. Also, some of power lines may be arranged on the same layer as the global data IO signal lines.

As described herein, the semiconductor memory device and the signal line arrangement method thereof can reduce a layout area size of the semiconductor memory device by providing one additional layer for signal lines and arranging the local data IO signal lines and the global data IO signal lines on the additionally provided layer.

Having described exemplary embodiments of the invention, it is noted that modifications and variations can be made by persons skilled in the art in light of the above teachings. Therefore, it is to be understood that changes may be made to embodiments of the invention disclosed that are nevertheless still within the scope and the spirit of the invention as defined by the appended claims.

What is claimed is:

1. A semiconductor memory device comprising:
a memory cell array comprising sub memory cell array regions, sub word line driver regions arranged on first and second areas between the sub memory cell array regions, and sense amplifier regions arranged on third and fourth areas between the sub memory cell array regions;
a peripheral circuit region;
word lines and local data IO signal lines arranged in the same direction on a first layer above the memory cell array;
column selecting signal lines and first global data IO signal lines arranged in a perpendicular direction to the word lines on a second layer above the memory cell array; and
second global data IO signal lines arranged in a perpendicular direction to the first global data IO signal lines on a third layer above the memory cell array.

2. The device of claim 1, wherein the memory cell array further comprises:
sub memory cell array regions comprising memory cells connected between bit lines and sub word lines, wherein the bit lines are arranged in a perpendicular direction to the word lines and the sub word lines are arranged in the same direction as the word lines;
sub word line driver regions arranged on first and second areas between the sub memory cell array regions; and
sense amplifier regions arranged on third and fourth areas between the sub memory cell array regions,
wherein the peripheral circuit region comprises a row address decoder, and the first global data IO signal lines are arranged above the sense amplifier regions and the sub memory cell array regions, and the second global data IO signal lines are arranged above the sub memory cell array regions and the sub word line driver regions.

3. The device of claim 2, wherein the memory cells are dynamic memory cells.

4. The device of claim 2, further comprising IO sense amplifiers connected to the second global data IO signal lines and arranged on the peripheral circuit region.

5. A semiconductor memory device comprising:
a memory cell array comprising sub memory cell array regions, sub word line driver regions arranged on first and second areas between the sub memory cell array regions, and sense amplifier regions arranged on third and fourth areas between the sub memory cell array regions;

a peripheral circuit region;

word lines and first local data IO signal lines arranged in the same direction on a first layer above the memory cell array;

second local data IO signal lines arranged in the same direction as the first local data IO signal lines on a second layer above the memory cell array;

column selecting signal lines and first global data IO signal lines arranged in a perpendicular direction to the word lines on a third layer above the memory cell array; and second global data IO signal lines arranged in a perpendicular direction to the first global data IO signal lines on the second layer.

6. The device of claim 5, wherein the first and second local data IO signal lines are divided into a predetermined number of partial local data IO signal lines wherein some of a first plurality of the divided partial local data IO signal lines are arranged in the same layer as the first local data IO signal line and the rest of the first plurality of the divided partial local data IO signal lines are arranged in the same layer as the second local data IO signal line, while some of a second plurality of the divided partial local data IO signal lines are arranged in the same layer as the first local data IO signal line and the rest of the divided partial local data IO signal lines are arranged in the same layer as the second local data IO signal line.

7. The device of claim 5, wherein the first and second local data IO signal lines are divided into local data IO signal line groups, each of the local data IO signal line groups comprising two pairs of the local data IO signal lines, which are alternately arranged adjacent to each other, and each of the local data IO signal lines comprises a plurality of partial local data IO signal lines.

8. The device of claim 6, wherein the plurality of partial local data IO signal lines of the first and second local data IO signal lines are connected to each other in a manner that one end of a first partial local data IO signal line divided from the first local data IO signal line and one end of the second partial local data IO signal line divided from the second local data IO signal line cross over each other to be connected, wherein the first partial local data IO signal line is arranged in the same layer where the first local data IO signal line is arranged, and the second partial local data IO signal line is arranged in the same layer where the second local data IO signal line is arranged.

9. The device of claim 5, wherein the memory cell array comprises:

sub memory cell array regions comprising memory cells connected between bit lines and sub word lines, wherein the bit lines are arranged in a perpendicular direction to the word lines and the sub word lines arranged in the same direction as the word lines;

sub word line driver regions arranged on first and second areas between the sub memory cell array regions; and sense amplifier regions arranged on third and fourth between the sub memory cell array regions, wherein the peripheral circuit region comprises a row address decoder, and the first and second local data IO signal lines are arranged in the sense amplifier regions, and the first global data IO signal lines are arranged above the sense amplifier regions and the sub memory cell array regions, and the second global data IO signal lines are arranged above the sub memory cell array regions and the sub word line driver regions.

10. The device of claim 9, wherein the memory cells are dynamic memory cells.

11. The device of claim 9, further IO sense amplifiers connected to the second global data IO signal lines and arranged on the peripheral circuit region.

12. The device of claim 9, wherein the first and second local data IO signal lines are divided into a predetermined number of partial local data IO signal lines wherein some of a first plurality of the divided partial local data IO signal lines are arranged in the same layer as the first local data IO signal line and the rest of the first plurality of the divided partial local data IO signal lines are arranged in the same layer as the second local data IO signal line, while some of a second plurality of the divided partial local data IO signal lines are arranged in the same layer as the first local data IO signal line and the rest of the divided partial local data IO signal lines are arranged in the same layer as the second local data IO signal line.

13. The device of claim 9, wherein the first and second local data IO signal lines are divided into local data IO signal line groups, each of the local data IO signal line groups comprising two pairs of the local data IO signal lines, which are alternately arranged adjacent to each other, and each of the local data IO signal lines comprises a plurality of partial local data IO signal lines.

14. The device of claim 12, wherein the plurality of partial local data IO signal lines of the first and second local data IO signal lines are connected to each other in a manner that one end of a first partial local data IO signal line divided from the first local data IO signal line and one end of the second partial local data IO signal line divided from the second local data IO signal line cross over each other to be connected, wherein the first partial local data IO signal line is arranged in the same layer where the first local data IO signal line is arranged, and the second partial local data IO signal line is arranged in the same layer where the second local data IO signal line is arranged.

15. The device of claim 14, further comprising:

IO sense amplifiers connected to the second global data IO signal lines and arranged on the peripheral circuit region.

16. An arrangement method of a semiconductor memory device having a memory cell array comprising sub memory cell array regions, sub word line driver regions arranged on first and second areas between the sub memory cell array regions, sense amplifier regions arranged on third and fourth areas between the sub memory cell array regions, and a peripheral region, the method comprising:

arranging first local data IO signal lines in the same direction and on the same layer as word lines above the sense amplifier regions;

arranging second local data IO signal lines in the same direction as the first local data IO signal lines, on a different layer from the word lines above the sense amplifier region;

arranging column selecting signal lines and first global data IO signal lines in a perpendicular direction to the word lines, on a different layer from the word lines and the second local data IO signal lines above sub memory cell array regions and sense amplifier regions; and arranging second global data IO signal lines in a perpendicular direction to the first global data IO signal lines, on the same layer as the second local data IO signal lines above the sub memory cell array region and the sub word line driver region.

17. The method of claim 16, further comprising:
arranging an IO sense amplifier connected to the second global data IO signal lines in the peripheral region.

18. The method of claim 16, wherein the first and second local data IO signal lines are divided into a predetermined number of partial local data IO signal lines wherein some of a first plurality of the divided partial local data IO signal lines are arranged in the same layer as the first local data IO signal line and the rest of the first plurality of the divided partial local data IO signal lines are arranged in the same layer as the second local data IO signal line, while some of a second plurality of the divided partial local data IO signal lines are arranged in the same layer as the first local data IO signal line and the rest of the divided partial local data IO signal lines are arranged in the same layer as the second local data IO signal line.

19. The method of claim 16, wherein the first and second local data IO signal lines are divided into local data IO signal line groups, each of the local data IO signal line groups comprising two pairs of the local data IO signal lines, which are alternately arranged adjacent to each other, and each of the local data IO signal lines comprises a plurality of partial local data IO signal lines.

20. The method of claim 18, wherein the plurality of partial local data IO signal lines of the first and second local data IO signal lines are connected to each other in a manner that one end of a first partial local data IO signal line divided from the first local data IO signal line and one end of a second partial local data IO signal line divided from the second local data IO signal line cross each other to be connected, wherein the first partial local data IO signal line is arranged in the same layer where the first local data IO signal line is arranged, and the second partial local data IO signal line is arranged in the same layer where the second local data IO signal line is arranged.

21. The method of claim 20, further comprising:
arranging an IO sense amplifier connected to the second global data IO signal lines in the peripheral region.

* * * * *